United States Patent
Lee et al.

(10) Patent No.: US 9,448,265 B2
(45) Date of Patent: Sep. 20, 2016

(54) APPARATUS AND METHOD FOR DETECTING OUTPUT PHASE DEFICIENCY IN INVERTER

(71) Applicant: LSIS CO., LTD., Anyang-si, Gyeonggi-do (KR)

(72) Inventors: Jae Moon Lee, Suwon-si (KR); Tae Suk Bae, Cheonan-si (KR)

(73) Assignee: LSIS CO., LTD., Anyang-si (KR)

( * ) Notice: Subject to any disclaimer, the term of this patent is extended or adjusted under 35 U.S.C. 154(b) by 2 days.

(21) Appl. No.: 14/539,658

(22) Filed: Nov. 12, 2014

(65) Prior Publication Data

US 2015/0138854 A1     May 21, 2015

(30) Foreign Application Priority Data

Nov. 18, 2013   (KR) ........................ 10-2013-0139801

(51) Int. Cl.
*G01R 25/00*     (2006.01)
*H02M 1/32*     (2007.01)
*H02P 29/02*     (2016.01)

(52) U.S. Cl.
CPC .............. *G01R 25/005* (2013.01); *H02M 1/32* (2013.01); *H02P 29/0243* (2016.02); *G01R 25/00* (2013.01); *H02P 29/023* (2013.01)

(58) Field of Classification Search
CPC ..... G01R 25/00; G01R 25/005; H02M 1/32; H02P 29/023
USPC ................................. 324/76.52, 76.39, 76.11
See application file for complete search history.

(56) References Cited

U.S. PATENT DOCUMENTS

| 2002/0093774 A1* | 7/2002 | Chung ................... H01H 9/542 361/2 |
| 2007/0040532 A1 | 2/2007 | Bae et al. |
| 2007/0165431 A1 | 7/2007 | Gunji |

(Continued)

FOREIGN PATENT DOCUMENTS

| JP | 05-172443 | 7/1993 |
| JP | 2003-052191 | 2/2003 |
| JP | 2003-164159 | 6/2003 |

(Continued)

OTHER PUBLICATIONS

European Patent Office Application Serial No. 14193371.3, Search Report dated May 13, 2015, 6 pages.

(Continued)

*Primary Examiner* — Hoai-An D Nguyen
(74) *Attorney, Agent, or Firm* — Lee, Hong, Degerman, Kang & Waimey; Jonathan Kang; Richard Salfelder (57) ABSTRACT

An apparatus and a method for detecting phase deficiency in an inverter is provided, the method including deciding whether a sector of the output current is a sector where current detection is possible based on switching operation status of the switching element in the inverter, maintaining a phase deficiency variable when deciding the current detection in the sector of the output current to be impossible, adding a count to a phase deficiency variable to accumulate when deciding the current detection in the sector of the output current to be possible and deciding the output current to be within a phase deficiency band, and determining as phase deficiency when the phase deficiency variable is greater than a prescribed detection level.

8 Claims, 10 Drawing Sheets

(56) References Cited

U.S. PATENT DOCUMENTS

2010/0117574 A1    5/2010    Gunji
2013/0121042 A1*    5/2013    Gan ........................ H02M 7/49
                                          363/37

FOREIGN PATENT DOCUMENTS

| | | |
|---|---|---|
| JP | 2009-061164 | 3/2009 |
| JP | 2010-081739 | 4/2010 |
| JP | 2013-055796 | 3/2013 |
| JP | 2013-106424 | 5/2013 |
| KR | 10-1202949 | 11/2012 |
| KR | 10-2013-0056060 | 5/2013 |

OTHER PUBLICATIONS

Korean Intellectual Property Office Application Serial No. 10-2013-0139801, Office Action dated Oct. 1, 2014, 4 pages.

Japan Patent Office Application Serial No. 2014-233595, Office Action dated Jan. 5, 2016, 2 pages.

* cited by examiner

APPARATUS AND METHOD FOR DETECTING OUTPUT PHASE DEFICIENCY IN INVERTER

CROSS-REFERENCE TO RELATED APPLICATIONS

Pursuant to 35 U.S.C. §119(a), this application claims the benefit of earlier filing date and right of priority to Korean Patent Application No. 10-2013-0139801, filed on Nov. 18, 2013, the contents of which are all hereby incorporated by reference herein in its entirety.

BACKGROUND

1. Field of the Disclosure

The present disclosure relates to an apparatus and a method for detecting phase deficiency in an inverter, and a method thereof.

2. Description of Related Art

Generally, an inverter is a device which converts 3-phase direct current (DC) into alternating current (AC).

Figure 1:
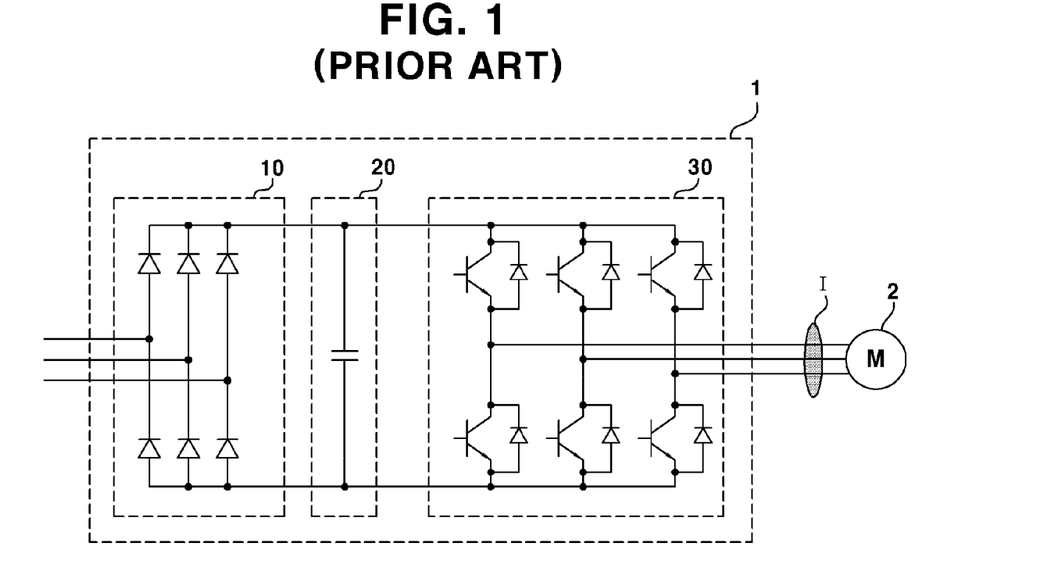
FIG. 1 is a block diagram illustrating a general inverter.

FIG. 1 is a block diagram illustrating a general inverter, which drives a motor (2).

The inverter (1) converts 3-phase AC power source into DC using a rectifying unit (10), then stores the converted DC in a DC link capacitor (20), and then converts it into AC again using a inverter unit (30) to provide the motor (2) with the converted AC. Additionally, the inverter (1) controls speed of the motor (2) by changing voltages and frequencies.

Here, at least one phase of the inverter output I may be opened. This phenomenon is referred to as "phase deficiency", which is caused by misconnection between the inverter (1) output end and the motor (2), or by malfunction of a switching device between the inverter (1) output end and the motor (2). When the phase deficiency occurs, an overcurrent exceeding rated current may be applied to the motor (2), causing a burning damage by degradation.

Such a phase deficiency of an inverter may be determined by detecting an output current of the inverter.

Figure 2A:
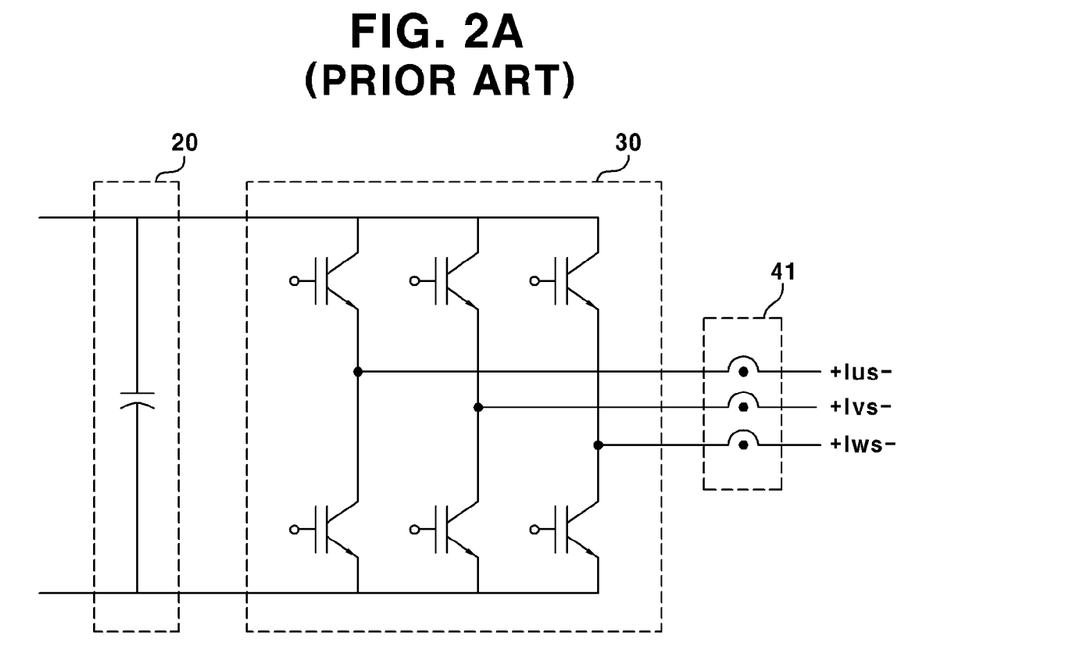
FIGS. 2a and 2b are block diagrams illustrating an inverter output current detection unit.
Figure 2B:
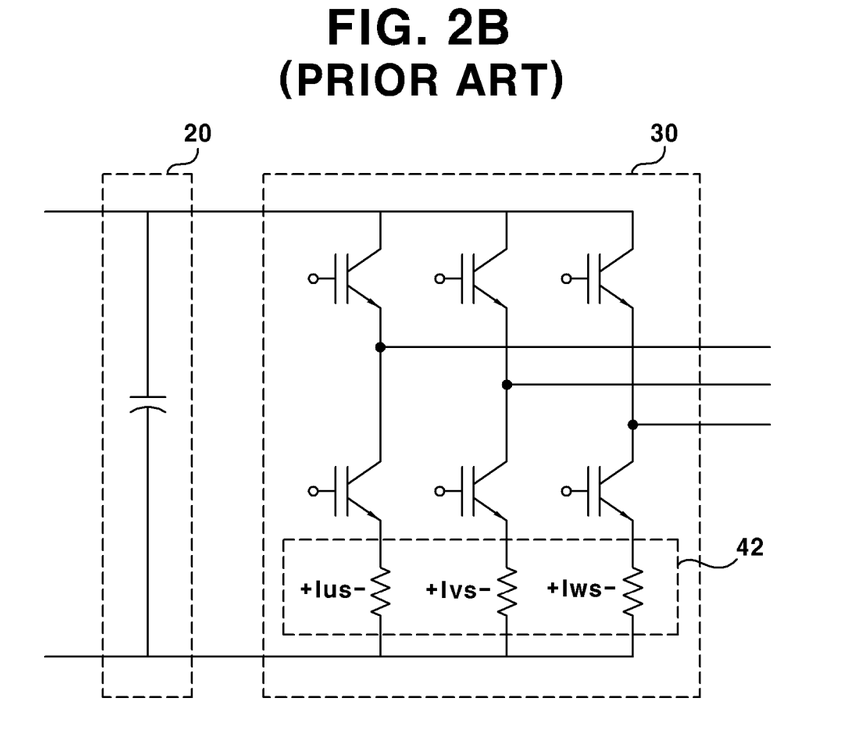

FIGS. 2a and 2b are block diagrams illustrating an inverter output current detection unit. FIG. 2a is illustrating a case in which a current transformer (CT) is used, and FIG. 2b is illustrating a case in which a leg-shunt resistor is used, respectively.

As illustrated in FIG. 2a, the CT (41) is arranged on the output line of the inverter (1), and detects 3-phase output current of the inverter unit (30). Meanwhile, as illustrated in FIG. 2b, the leg-shunt resistor (42) is arranged on the emitter end of the insulated gate bipolar transistor (IGBT) on each phase of the inverter unit (30), and detects output current of the inverter unit (30) when the current is flowing to the lower IGBT by switching operation status of the inverter unit (30).

Figure 3:
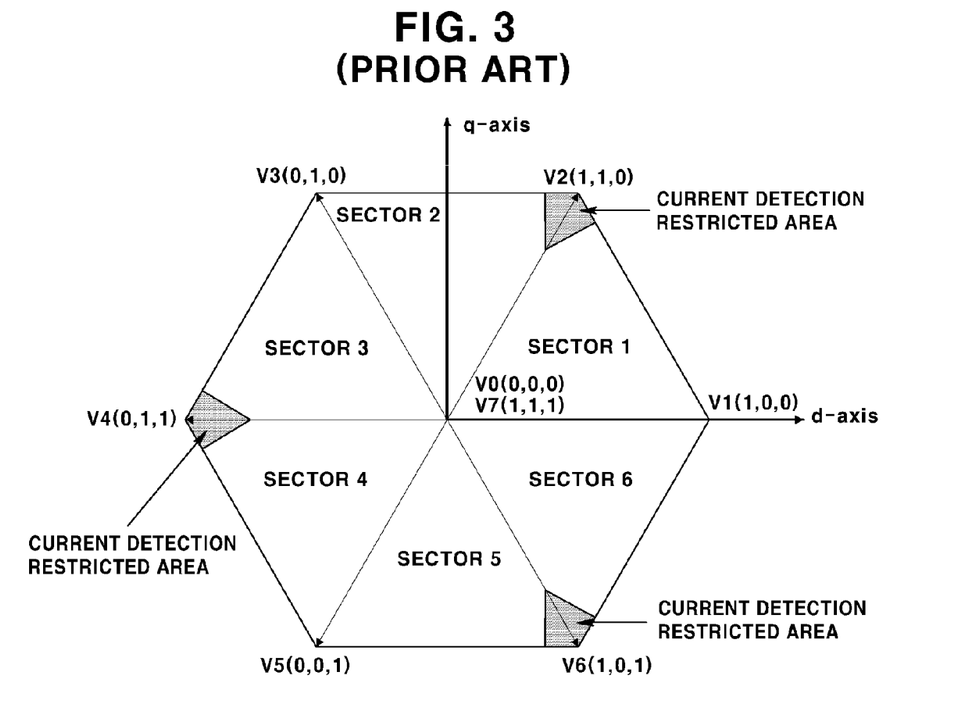
FIG. 3 is an exemplary view illustrating output current detection restricted by switching operation status of an inverter.

FIG. 3 is an exemplary view illustrating output current detection restricted by switching operation status of an inverter.

As illustrated in FIG. 3, because the current detection area is restricted by switching operation status and current conduction time of the inverter unit (30), in order to expand the current detection area, the inverter output current detection using a leg-shunt resistor takes a process which detects the active 2-phase current among the 3-phase current of the inverter, and then calculates the rest of one phase current. The following is a table showing calculations of current detection in the current detection using a leg-shunt resistor.

TABLE 1

| Sector Information | Iu | Iv | Iw |
|---|---|---|---|
| 1 | Iu = (Ivs + Iws) | Ivs = −Ivs | Iw = −Iws |
| 2 | Iu = −Ius | Ivs = (Ius + Iws) | Iw = −Iws |
| 3 | Iu = −Ius | Ivs = (Ius + Iws) | Iw = −Iws |
| 4 | Iu = −Ius | Ivs = −Ivs | Iw = (Ius + Ivs) |
| 5 | Iu = −Ius | Ivs = −Ivs | Iw = (Ius + Ivs) |
| 6 | Iu = (Ivs + Iws) | Ivs = −Ivs | Iw = −Iws |

Such a current detection using a leg-shunt resistor is commonly used for a small inverter of low-price type, because it is able to be performed at lower cost compared to the current detection using a CT.

However, because this current detection method using a leg-shunt resistor is to calculate the rest of one phase current after detecting the active 2-phase current among the 3-phase current of the inverter, there is a problem that a precise detection of the phase deficiency is not available.

SUMMARY OF THE DISCLOSURE

The technical challenge which the present disclosure intends to achieve is, to precisely detect a phase deficiency in output of an inverter when a current is detected by a leg-shunt resistor.

In order to complete the aforementioned technical challenge, in one general aspect of the present disclosure, there is provided a method for detecting phase deficiency of output current, by receiving output current from a leg-shunt resistor in an inverter including a plurality of switching elements, the method comprising: deciding whether a sector of the output current is a sector where current detection is possible based on switching operation status of the switching element in the inverter; maintaining a phase deficiency variable when deciding the current detection in the sector of the output current to be impossible; adding a count to a phase deficiency variable to accumulate when deciding the current detection in the sector of the output current to be possible and deciding the output current to be within a phase deficiency band; and determining as phase deficiency when the phase deficiency variable is greater than a prescribed detection level.

In some exemplary embodiment of the present invention, the method may further comprise determining a 3-phase output currents based on a 2-phase output currents received from the leg-shunt resistor.

In some exemplary embodiment of the present invention, the method may further comprise subtracting a count from the phase deficiency variable to accumulate when deciding the current detection in the sector of the output current to be possible and deciding the output current to be outside of the phase deficiency band.

In some exemplary embodiment of the present invention, the method may further comprise performing a predetermined protective action when determined as the phase deficiency.

In addition, in order to complete the aforementioned technical challenge, in another general aspect of the present disclosure, there is provided an apparatus for detecting phase deficiency, the apparatus comprising: an inverter including a plurality of switching elements; a leg-shunt resistor connected to a part of switching elements among the plurality of switching elements in the inverter; a first determining unit configured to determine a 3-phase output currents based on a 2-phase output currents determined by the leg-shunt resistor; and a second determining unit configured to: decide whether a sector of the output current is a sector where current detection is possible based on switching operation status of the switching element in the inverter, maintain a phase deficiency variable when deciding the current detection in the sector of the output current to be impossible, add a count to a phase deficiency variable to accumulate when deciding the current detection in the sector of the output current to be possible and deciding the output current to be within a phase deficiency band, and determine as phase deficiency when the phase deficiency variable is greater than a prescribed detection level.

In some exemplary embodiment of the present invention, the second determining unit may subtract a count from the phase deficiency variable to accumulate when deciding the current detection in the sector of the output current to be possible and deciding the output current to be outside of the phase deficiency band.

In some exemplary embodiment of the present invention, the second determining unit may perform a predetermined protective action when determined as the phase deficiency.

According to an embodiment of the present disclosure as described in the above, a precise detection of phase deficiency in output of an inverter is possible, when using a leg-shunt resistor in detection of the inverter output current.

DETAILED DESCRIPTION

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. Rather, the described aspect is intended to embrace all such alterations, modifications, variations, and equivalents that fall within the scope and novel idea of the present disclosure.

Hereinafter, referring to enclosed figures, an exemplary embodiment of the present disclosure will be described in detail.

Figure 4:
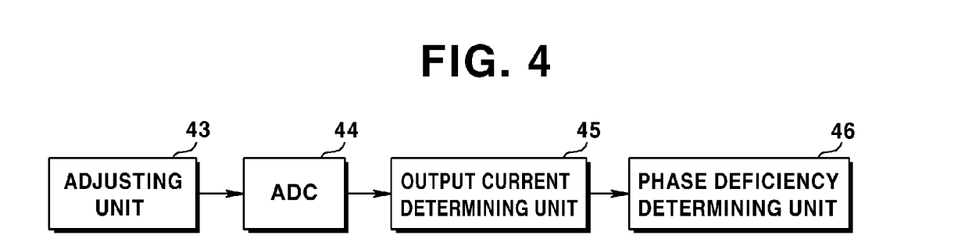
FIG. 4 is a block diagram illustrating an apparatus for detecting phase deficiency according to an embodiment of the present disclosure.

FIG. 4 is a block diagram illustrating an apparatus for detecting phase deficiency according to an exemplary embodiment of the present disclosure. The apparatus may receive an output current of an inverter from the leg-shunt resistor of FIG. 2b, and may determine whether there is phase deficiency in the output current.

As illustrated, the apparatus for detecting phase deficiency according to an exemplary embodiment of the present disclosure may comprise an adjusting unit (43), an analog-digital converter (ADC) (44), an output current determining unit (45), and a phase deficiency determining unit (46).

The adjusting unit (43) may perform low pass filtering (LPF) and scale adjusting for the output current from the leg-shut resistor. The ADC (44) may convert the output current into digital data. And the output current determining unit (45) may calculate 1-phase current from 2-phase currents.

Here, the output current determining unit (45) may calculate the 1-phase current from the 2-phase currents using TABLE 1 in the above herein.

The phase deficiency determining unit (46) may determine whether there is phase deficiency in each phase of the output current by receiving a 3-phase output current from the inverter. The phase deficiency determining unit (46) may determine that there is phase deficiency when each phase of the inverter output current is maintained for a predetermined period of time in a phase deficiency band. When the phase deficiency occurs, the output current is maintained in the predetermined phase deficiency band. The phase deficiency band means a section in which the current is constantly maintained when the phase deficiency occurs. The phase deficiency band may be predetermined.

Hereinafter, the conventional method wherein the phase deficiency determining unit detects the phase deficiency will be described beforehand, and then the method according to an exemplary embodiment of the present disclosure will be described in comparison to the conventional method.

Figure 5:
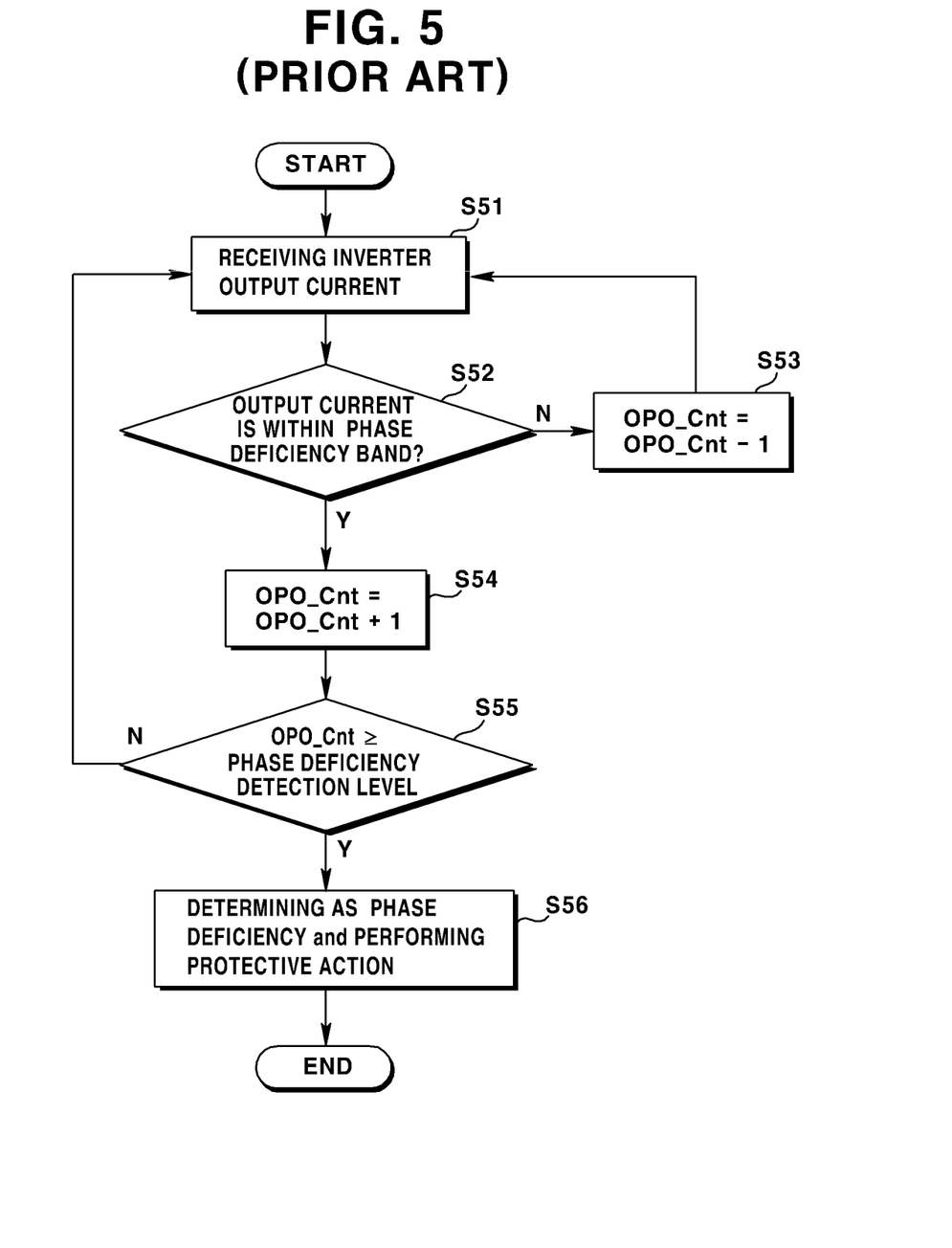
FIG. 5 is a flow chart illustrating a conventional method for detecting phase deficiency.

FIG. 5 is a flow chart illustrating a conventional method for detecting phase deficiency.

As shown, the phase deficiency determining unit (46), by receiving (S51) the inverter output current, determines (S52) whether an output current is outputted in the phase deficiency band in every inverter output current detection cycle.

When the inverter output current is within the phase deficiency band, the phase deficiency determining unit (46) adds a count to a phase deficiency variable (OPO_Cnt) to accumulate (S54). Such a process is repeated in every inverter output current detection cycle.

However, when the output current is outside of the phase deficiency band, the phase deficiency determining unit (46) subtracts a count from a phase deficiency variable (OPO_Cnt) to prevent phase deficiency detection in normal operations of the inverter (S53).

When the accumulated phase deficiency variable (OPO_Cnt) is greater than a phase deficiency detection level (S55), the phase deficiency determining unit (46) determines that there is phase deficiency in the inverter, and performs a predetermined protective action (S56).

Figure 6:
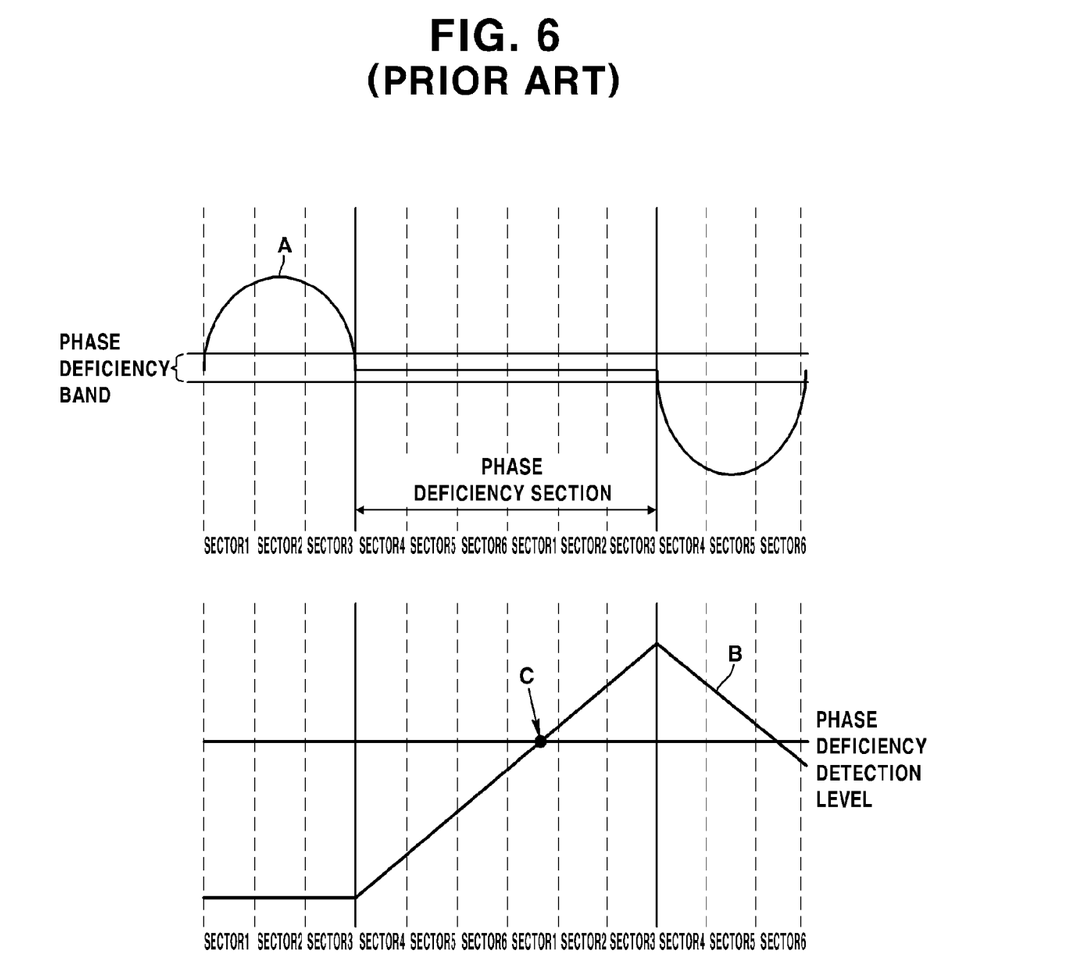
FIG. 6 is an exemplary view illustrating a case of output current deficiency detection in a conventional phase deficiency detection method using a current transformer (CT).

FIG. 6 is an exemplary view illustrating a case of output current deficiency detection in a conventional phase deficiency detection method using a CT (41). In this case, there occurs phase deficiency in U-phase.

As illustrated, when the inverter output current (A) is within the phase deficiency band, a count is added to the phase deficiency variable (B). When the phase deficiency variable (B) is greater than the phase deficiency detection level (C), it is determined as phase deficiency.

Figure 7:
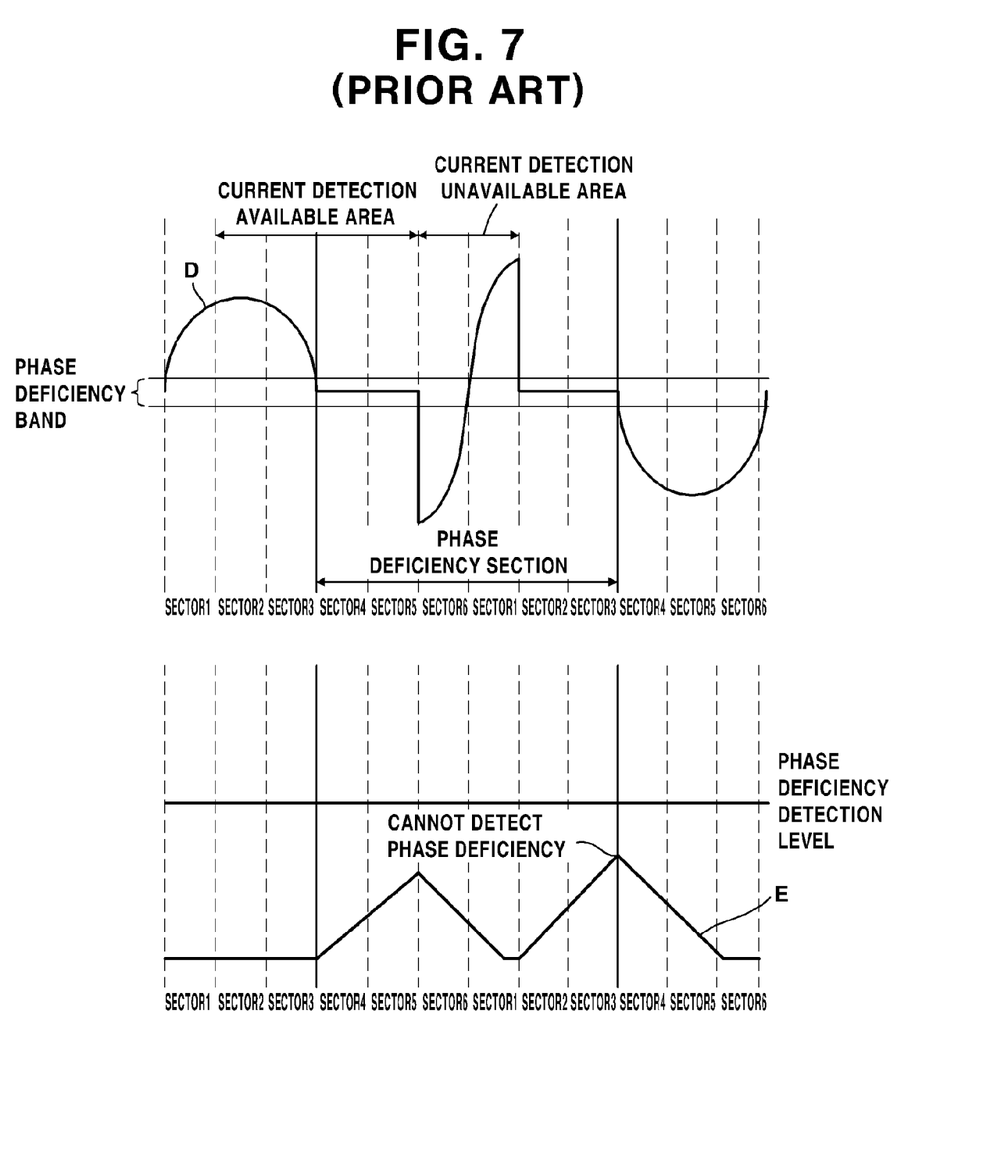
FIG. 7 is an exemplary view illustrating a case of output current deficiency detection in a conventional phase deficiency detection method using a leg-shunt resistor.

FIG. 7 is an exemplary view illustrating a case of output current deficiency detection in a conventional phase deficiency detection method using a leg-shunt resistor. In this case, there occurs phase deficiency in U-phase.

However, because the output current detection method using a leg-shunt resistor is to calculate the rest of one phase current after detecting the active 2-phase current among the 3-phase current of the inverter by switching sectors, a precise detection of the phase deficiency is not available.

That is to say, as illustrated in FIG. 7, when there occurs the phase deficiency in the U-phase output current (D) for a period of one cycle, the counts are added to the phase deficiency variable (E) in sectors 2 to 5. However, because the output current is calculated in sectors 1 and 6 in which the U-phase current is calculated based on the current of other phases, the counts are subtracted from the phase deficiency variable (E) in the phase deficiency section. Therefore, there arises a problem that the phase deficiency is not able to be detected in the phase deficiency section.

Figure 8:
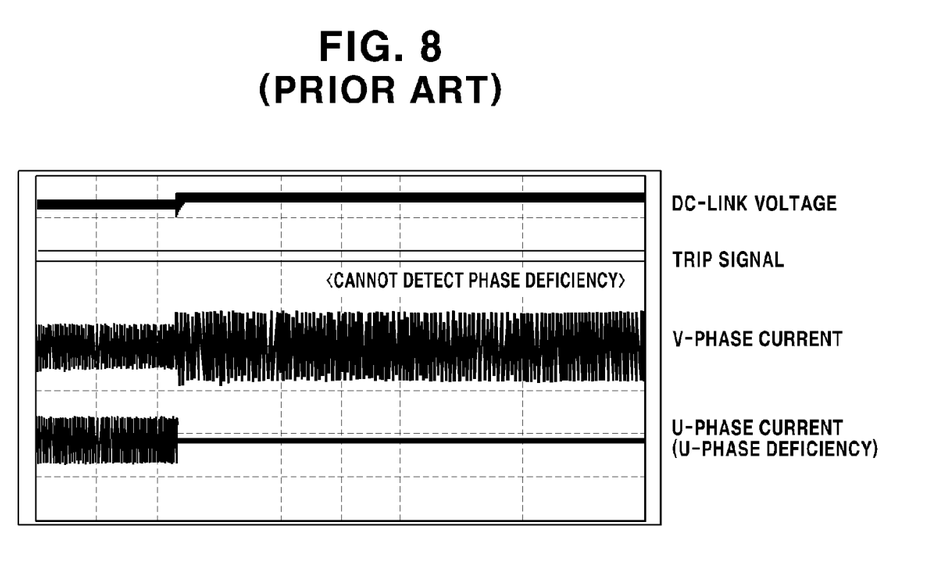
FIG. 8 is an experimental waveform diagram of conventional phase deficiency detection method using a leg-shunt resistor.

FIG. 8 is an experimental waveform diagram of conventional phase deficiency detection method using a leg-shunt resistor. It is apparent that the phase deficiency is not able to be detected even by the U-phase deficiency.

As a solution to such a problem in the conventional art, the apparatus and the method according to an exemplary embodiment of the present disclosure may precisely detect the phase deficiency using a leg-shut resistor.

Figure 9:
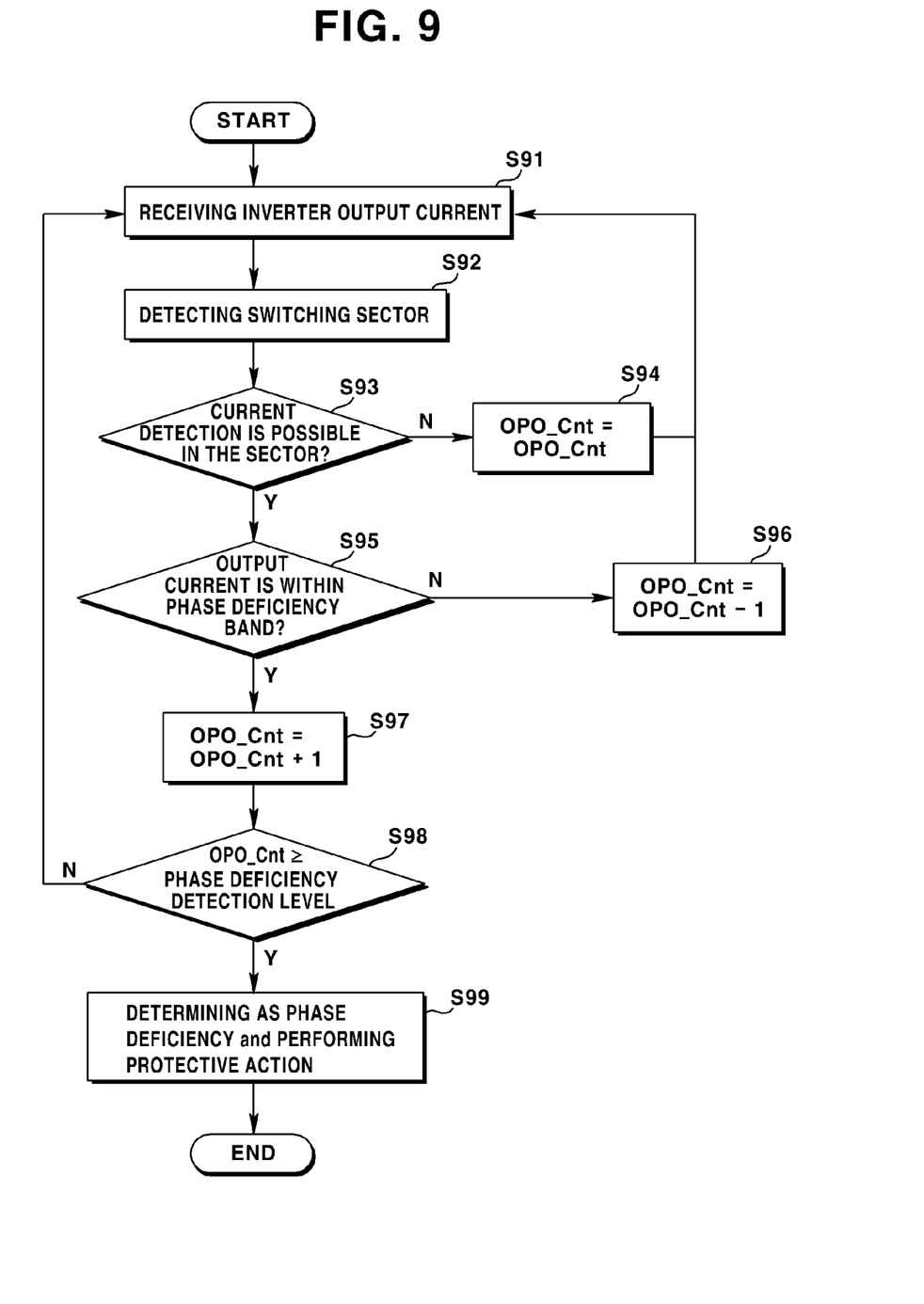
FIG. 9 is a flow chart illustrating a method for detecting phase deficiency according to an exemplary embodiment of the present disclosure.

FIG. 9 is a flow chart illustrating a method for detecting phase deficiency according to an exemplary embodiment of the present disclosure. The method may be performed by the apparatus for detecting phase deficiency as illustrated in FIG. 4.

As illustrated in FIG. 9, according to an exemplary embodiment of the present disclosure, the output current determining unit (45) may determine a 3-phase output current (S91), by receiving a 2-phase current among the inverter output current from the leg-shunt resistor.

At this moment, the phase deficiency determining unit (46) detects a sector based on switching operation status of the switching element in the inverter (S92). When it is decided that current detection of the relevant phase in the sector is impossible (S93), that is, when the current is of the phase calculated by the output current determining unit (45) through the current detected by the leg-shunt resistor, the phase deficiency determining unit (46) maintains the phase deficiency variable (OPP_Cnt) (S94). Only when it is decided that current detection is possible in the sector, the process may be moved to the next step.

That is, when it is decided that current detection is possible in the sector (S93), the phase deficiency determining unit (46) ascertains whether the output current is within the phase deficiency band (S95). When it is ascertained that output current is within the phase deficiency band, the phase deficiency determining unit (46) adds a count to a phase deficiency variable (OPO_Cnt) to accumulate (S97), and repeats the same process in every output current detection cycle.

However, when it is ascertained that the output current is outside of the phase deficiency band, the phase deficiency determining unit (46) subtracts a count from a phase deficiency variable (OPO_Cnt) to prevent phase deficiency detection in normal operations of the inverter (S96).

Afterwards, when the accumulated phase deficiency variable (OPO_Cnt) becomes greater than a phase deficiency detection level (S98), the phase deficiency determining unit (46) determines it as an output current deficiency in the inverter, and performs a predetermined protective action (S99).

Figure 10:
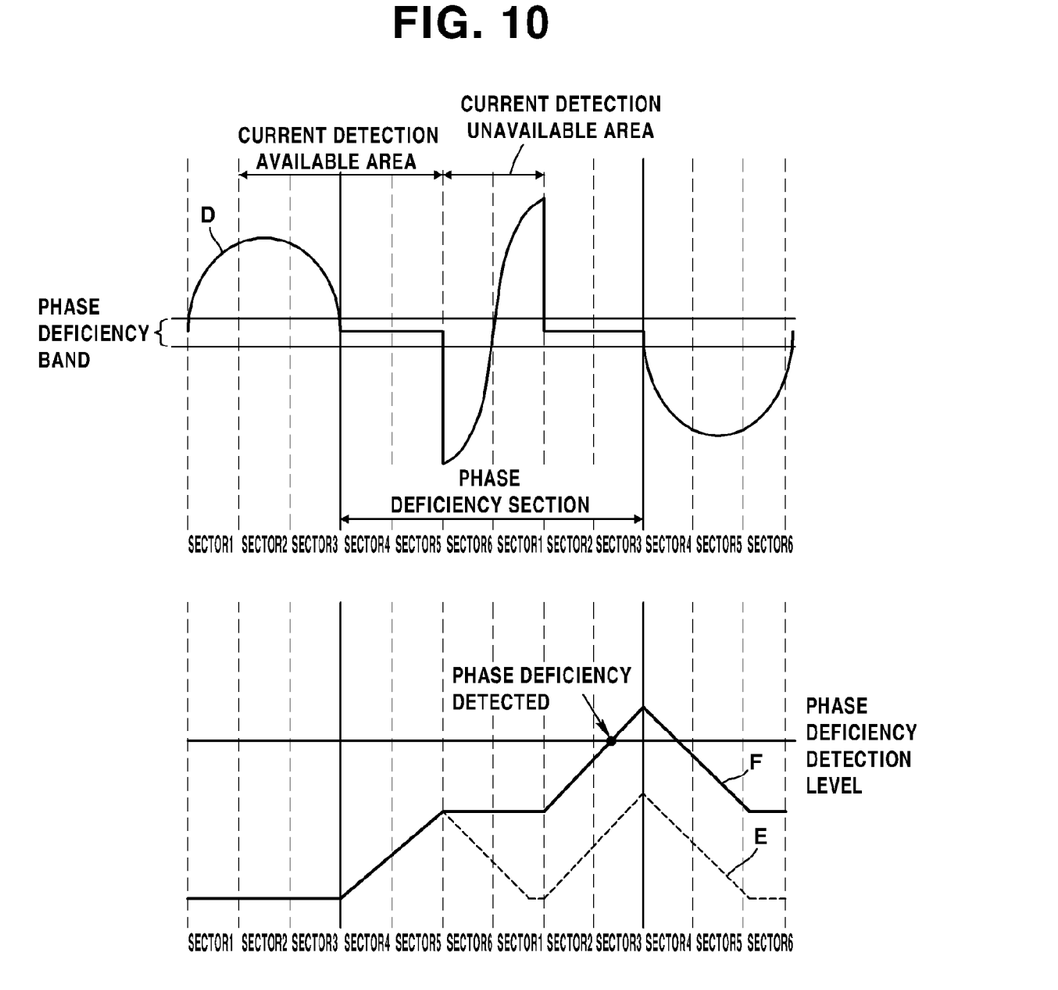
FIG. 10 is an exemplary view illustrating a method for detecting phase deficiency according to an exemplary embodiment of the present disclosure.

FIG. 10 is an exemplary view illustrating a method for detecting phase deficiency according to an exemplary embodiment of the present disclosure. Here in the case illustrated in this figure, there occurs an output current deficiency in U-phase during a period of one cycle.

As illustrated, when there occurs phase deficiency the U-phase output current (D) for a period of a cycle, according to an exemplary embodiment of the present disclosure, the counts are added to the phase deficiency variable (F) in sectors 2 to 5 which the U-phase current is detected. In addition, in sectors 1 and 6 in which the U-phase current is calculated based on the current of other phases, the phase deficiency variable (F) is maintained without any change. Therefore, the precise detection of phase deficiency is available. That is to say, the phase deficiency is not able to be detected by the conventional detection method (E), whereas the phase deficiency is able to be detected according to an exemplary embodiment of the present disclosure (F).

Figure 11:
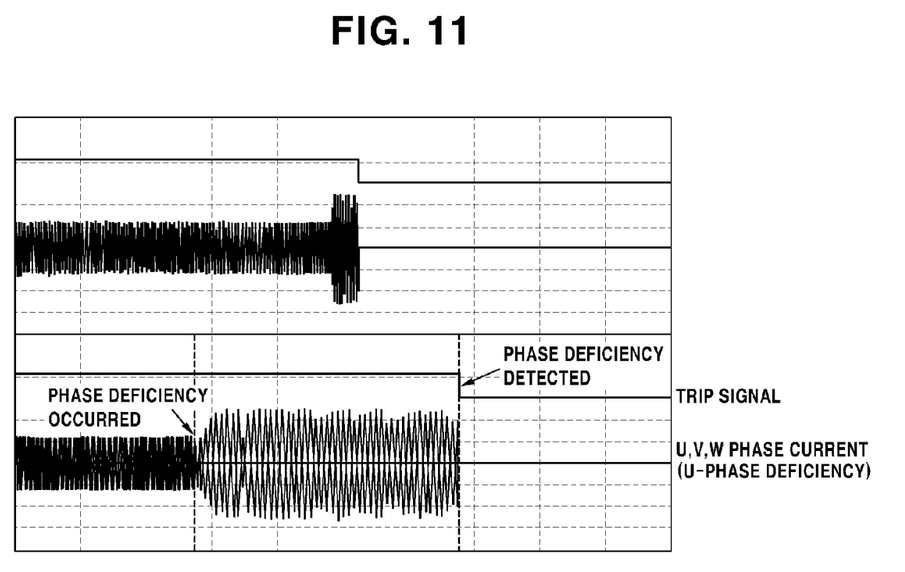
FIG. 11 is a signal waveform diagram illustrating a method for detecting phase deficiency according to an exemplary embodiment of the present disclosure.

FIG. 11 is a signal waveform diagram illustrating a method for detecting phase deficiency according to an exemplary embodiment of the present disclosure.

As illustrated, it is apparent that, when there is a deficiency in the U-phase among the U, V, and W phases, the phase deficiency is able to be precisely detected so as to generate a trip signal initiating the protective action.

The abovementioned exemplary embodiments are intended to be illustrative, and not to limit the scope of the claims. Many alternatives, modifications, variations, and equivalents will be apparent to those skilled in the art. The features, structures, methods, and other characteristics of the exemplary embodiments described herein may be combined in various ways to obtain additional and/or alternative exemplary embodiments. Therefore, the technical scope of the rights for the present disclosure shall be decided by the claims.

What is claimed is:

1. A method for detecting phase deficiency of output current in an inverter that includes a plurality of switching elements, the method comprising:
   receiving output current from a leg-shunt resistor in the inverter;
   detecting a sector based on a switching operation status of one of the plurality of switching elements;
   deciding whether detection of the output current is possible in the detected sector;
   maintaining a phase deficiency count when detection of the output current is not possible in the detected sector;
   incrementing the phase deficiency count when detection of the output current is possible in the detected sector and the output current is within a phase deficiency band; and
   determining the phase deficiency when the phase deficiency count is greater than a phase deficiency detection level.

2. The method of claim 1, further comprising:
   determining a 3-phase output current based on a 2-phase output current received from the leg-shunt resistor.

3. The method of claim 1, further comprising:
decrementing the phase deficiency count when detection of the output current is possible in the detected sector and the output current is outside the phase deficiency band.

4. The method of claim 1, further comprising:
performing a predetermined protective action when the phase deficiency is determined.

5. An apparatus for detecting phase deficiency of output current in an inverter that includes a plurality of switching elements, the apparatus comprising:
a leg-shunt resistor in the inverter;
a first determining unit configured to receive output current from the leg-shunt resistor; and
a second determining unit configured to:
detect a sector based on a switching operation status of one of the plurality of switching elements;
decide whether detection of the output current is possible in the detected sector;
maintain a phase deficiency count when detection of the output current is not possible in the detected sector;
increment the phase deficiency count when detection of the output current is possible in the detected sector and the output current is within a phase deficiency band, and
determine the phase deficiency when the phase deficiency count is greater than a phase deficiency detection level.

6. The apparatus of claim 5, wherein the second determining unit is further configured to decrement the phase deficiency count when detection of the output current is possible in the detected sector and the output current is outside the phase deficiency band.

7. The apparatus of claim 5, wherein the second determining unit is further configured to perform a predetermined protective action when phase deficiency is determined.

8. The apparatus of claim 5, wherein the first determining unit is further configured to determine a 3-phase output current based on a 2-phase output current received from the leg-shunt resistor.

* * * * *